(12) United States Patent
Li

(10) Patent No.: US 9,899,530 B2
(45) Date of Patent: Feb. 20, 2018

(54) LOW TEMPERATURE POLY-SILICON THIN-FILM TRANSISTOR AND MANUFACTURING METHOD THEREOF

(71) Applicant: Shenzhen China Star Optoelectronics Technology Co., Ltd., Shenzhen, Guangdong (CN)

(72) Inventor: Jinming Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 84 days.

(21) Appl. No.: 14/424,432

(22) PCT Filed: Feb. 9, 2015

(86) PCT No.: PCT/CN2015/072595
§ 371 (c)(1),
(2) Date: Feb. 26, 2015

(87) PCT Pub. No.: WO2016/101402
PCT Pub. Date: Jun. 30, 2016

(65) Prior Publication Data
US 2016/0343874 A1 Nov. 24, 2016

(30) Foreign Application Priority Data
Dec. 26, 2014 (CN) .......................... 2014 1 0837376

(51) Int. Cl.
*H01L 33/00* (2010.01)
*G06F 9/45* (2006.01)
(Continued)

(52) U.S. Cl.
CPC .. *H01L 29/78675* (2013.01); *H01L 21/02532* (2013.01); *H01L 21/02592* (2013.01);
(Continued)

(58) Field of Classification Search
CPC ............ H01L 21/7654; H01L 27/1203; H01L 27/1214; H01L 27/1266; H01L 29/78603;
(Continued)

(56) References Cited

U.S. PATENT DOCUMENTS 9,508,859 B2 * 11/2016 Huang .............. H01L 29/78633
2001/0043292 A1 * 11/2001 Tsujimura ............. G02F 1/1368
349/43
(Continued)

FOREIGN PATENT DOCUMENTS

CN 103268855 A * 8/2013 ....... G02F 1/136209

*Primary Examiner* — Mary Wilczewski
*Assistant Examiner* — Tsz Chiu
(74) *Attorney, Agent, or Firm* — Andrew C. Cheng

(57) ABSTRACT

The present invention provides a low temperature poly-silicon thin-film transistor, as well as a manufacturing method thereof, which includes: a substrate (1), a light shield layer (2) formed on the substrate (1), a pad layer (3) formed on the light shield layer (2), a dielectric layer (4) formed on the pad layer, an active layer (5) formed on the dielectric layer, a gate insulation layer (6) formed on the active layer (5), and a gate layer (7) formed on the gate insulation layer (6). The light shield layer (2) includes a planar section (21) formed on the substrate (1) and a raised section (22) formed on the planar section (21). The active layer (5) has a projection that covers at least a partial area of an upper surface of the raised section (22) and one of sidewalls (224) of the raised section (22). Without varying an aperture ratio of a display device, the channel width can be effectively increased and the width-to-length ratio can be increased so as to increase an open state current and enhance driving power of the LTPS TFT and device performance.

8 Claims, 3 Drawing Sheets

(51) Int. Cl.
 *H01L 29/786* (2006.01)
 *H01L 21/02* (2006.01)
 *H01L 21/306* (2006.01)
 *H01L 27/32* (2006.01)
 *H01L 29/06* (2006.01)
 *H01L 29/66* (2006.01)

(52) U.S. Cl.
 CPC .. *H01L 21/02667* (2013.01); *H01L 21/30604* (2013.01); *H01L 27/3272* (2013.01); *H01L 29/0684* (2013.01); *H01L 29/66757* (2013.01); *H01L 29/786* (2013.01); *H01L 2227/323* (2013.01)

(58) Field of Classification Search
 CPC ........... H01L 29/78633; H01L 27/1218; H01L 2221/68359; H01L 2221/68363; H01L 51/5284; H01L 27/322; H01L 27/3262; H01L 51/56; H01L 2227/323; H01L 27/1225; Y10S 438/977; G02F 1/133512; G02F 1/1339
 See application file for complete search history.

(56) References Cited

U.S. PATENT DOCUMENTS

| | | | |
|---|---|---|---|
| 2002/0034698 A1* | 3/2002 | Uno ....................... | G02B 5/201 430/7 |
| 2002/0070454 A1* | 6/2002 | Yasukawa ......... | H01L 21/76254 257/760 |
| 2006/0146209 A1* | 7/2006 | Kretz ................ | G02F 1/136213 349/38 |
| 2008/0203396 A1* | 8/2008 | Hiroshima ........ | G02F 1/136209 257/72 |
| 2009/0014721 A1* | 1/2009 | Tanabe ............. | H01L 29/78633 257/59 |
| 2012/0154728 A1* | 6/2012 | Oh ........................ | H01L 27/124 349/138 |

* cited by examiner

LOW TEMPERATURE POLY-SILICON THIN-FILM TRANSISTOR AND MANUFACTURING METHOD THEREOF

BACKGROUND OF THE INVENTION

1. Field of the Invention

The present invention relates to the field of displaying technology, and in particular to a low temperature poly-silicon thin-film transistor and a manufacturing method thereof.

2. The Related Arts

With the development of the displaying technology, flat panel displays, which have various advantages, such as high image quality, low power consumption, thin device body, and wide applications, have been widely used in various electronic consumer electronic products, such as mobile phones, televisions, personal digital assistants (PDAs), digital cameras, notebook computers, and desktop computers, and become the main stream of the display devices.

Active matrix (AM) flat panel displays are one of the most commonly used display device today. The active matrix flat panel display device includes a thin-film transistor to control input of a data signal in order to the control the displaying of an image.

Currently, the displaying technology is under fast development toward high definition. For example, the definition of a mobile phone has also reach a level as high as 1080P (1080×1920) and that of a television reaches even a higher level of 4K (4096×2160). With the increasingly heightening of definition, the driving power of the TFT device must be enhanced. Thus, a low temperature poly-silicon (LTPS) TFT, which possesses advantages high definition, fast response speed, high brightness, and high aperture ratio, is attracting increasing attention. To suit the need of driving power for high definition display devices, open state currents of a pixel zone and a driving zone of the display device must be increased and the way to increase the open state currents is to increase the width-to-length ratio of a channel of the TFT device. Specifically, the relationship between the open state current $I_D$ and the width-to-length ratio, W/T, of the TFT device is defined by the following equations: $I_D=(W/T)\mu C_{OX}(V_G-V_T)V_D$ for linear area; and $I_D=(1/2)(W/T)\mu C_{OX}(V_G-V_T)^2$ for saturation area. It can be found from the above equations, for both linear area and saturation area, there are two ways to increase the open state currents, one being increasing the channel width W. However, with the increase of the channel width W, the aperture ratio of the display device is decreased thereby reducing the design flexibility of a panel. The second way is to shorten the channel length L. However, excessively shortened channel length L will increase the risk of breaking through of the channel. Consequently, the range of variability of the channel length L is limited.

SUMMARY OF THE INVENTION

An object of the present invention is to provide a low temperature poly-silicon (LTPS) thin-film transistor (TFT) for driving an active matrix display device, wherein the LTPS TFT allows for an effective increase of a channel width without varying the aperture ratio of the display device so as to increase the width-to-length ratio of the channel and heighten an open state current thereby enhancing a driving power of the LTPS TFT and the device performance.

Another object of the present invention is to provide a LTPS TFT manufacturing method, wherein the manufacturing method allows for the manufacture of a LTPS TFT having an increased channel width and an increased with-to-length ratio of the channel so as to increase an open state current to provide the LTPS TFT with excellent driving power and device performance.

To achieve the above objects, the present invention provides a low temperature poly-silicon thin-film transistor, which comprises: a substrate, a light shield layer formed on the substrate, a pad layer formed on the light shield layer, a dielectric layer formed on the pad layer, an active layer formed on the dielectric layer, a gate insulation layer formed on the active layer, and a gate layer formed on the gate insulation layer;

wherein the light shield layer comprises a planar section formed on the substrate and a raised section formed on the planar section; and the active layer has a projection that covers at least a partial area of an upper surface of the raised section and one of sidewalls of the raised section.

The light shield layer comprises a material of molybdenum.

The light shield layer has a thickness at the site of the raised section, which is 800-2500 angstroms; the raised section has a height of 300-800 angstroms; angles between two opposite sidewalls of the raised section and the pad layer are 35°-70°.

The pad layer comprises a material of silicon nitride having a thickness of 400-500 angstroms and the dielectric layer comprises a material of silicon dioxide having a thickness of 1000-2000 angstroms.

The active layer has a thickness of 400-500 angstroms.

The present invention also provides a manufacturing method of a low temperature poly-silicon thin-film transistor, which comprises the following steps:

(1) providing a substrate, depositing a light shield layer on the substrate through physical vapor deposition, and forming a planar section and a raised section of the light shield layer through gray tone exposure and etching;

(2) sequentially depositing a pad layer and a dielectric layer on the light shield layer through plasma enhanced chemical vapor deposition;

(3) depositing an amorphous silicon layer on an area of the dielectric layer that corresponds to the raised section of the light shield layer in such a way that the amorphous silicon layer has a projection that completely covers the raised section and then converting the amorphous silicon layer into a poly-silicon layer;

(4) etching the poly-silicon layer to form an active layer in such a way that the active layer covers at least a partial area of an upper surface of the raised section and one of sidewalls of the raised section; and (5) sequentially forming, through deposition and etching, a gate insulation layer and a gate layer on the active layer.

In step (1), the light shield layer comprises a material of molybdenum.

In step (1), the light shield layer has a thickness at the site of the raised section, which is 800-2500 angstroms; the raised section has a height of 300-800 angstroms; and angles between two opposite sidewalls of the raised section and the pad layer are 35°-70°.

In step (2), the pad layer comprises a material of silicon nitride having a thickness of 400-500 angstroms and the dielectric layer comprises a material of silicon dioxide having a thickness of 1000-2000 angstroms.

In step (4), the active layer has a thickness of 400-500 angstroms.

The present invention further provides a low temperature poly-silicon thin-film transistor, which comprises: a substrate, a light shield layer formed on the substrate, a pad layer formed on the light shield layer, a dielectric layer formed on the pad layer, an active layer formed on the dielectric layer, a gate insulation layer formed on the active layer, and a gate layer formed on the gate insulation layer;

wherein the light shield layer comprises a planar section formed on the substrate and a raised section formed on the planar section; and the active layer has a projection that covers at least a partial area of an upper surface of the raised section and one of sidewalls of the raised section;

wherein the light shield layer comprises a material of molybdenum; and wherein the pad layer comprises a material of silicon nitride having a thickness of 400-500 angstroms and the dielectric layer comprises a material of silicon dioxide having a thickness of 1000-2000 angstroms.

The efficacy of the present invention is that the present invention provides a LTPS TFT and a manufacturing method thereof, which comprises formation of a light shield layer having a raised portion on the substrate and then formation of other constituent portions on the light shield layer in order to effectively increase a width of a channel of the LTPS TFT and a width-to-length ratio of the channel to increase an open state current and thus improving the driving power and device performance of the LTPS TFT but not affecting the aperture ratio of the display device. The manufacturing method used has a simple process and is easy to operate.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
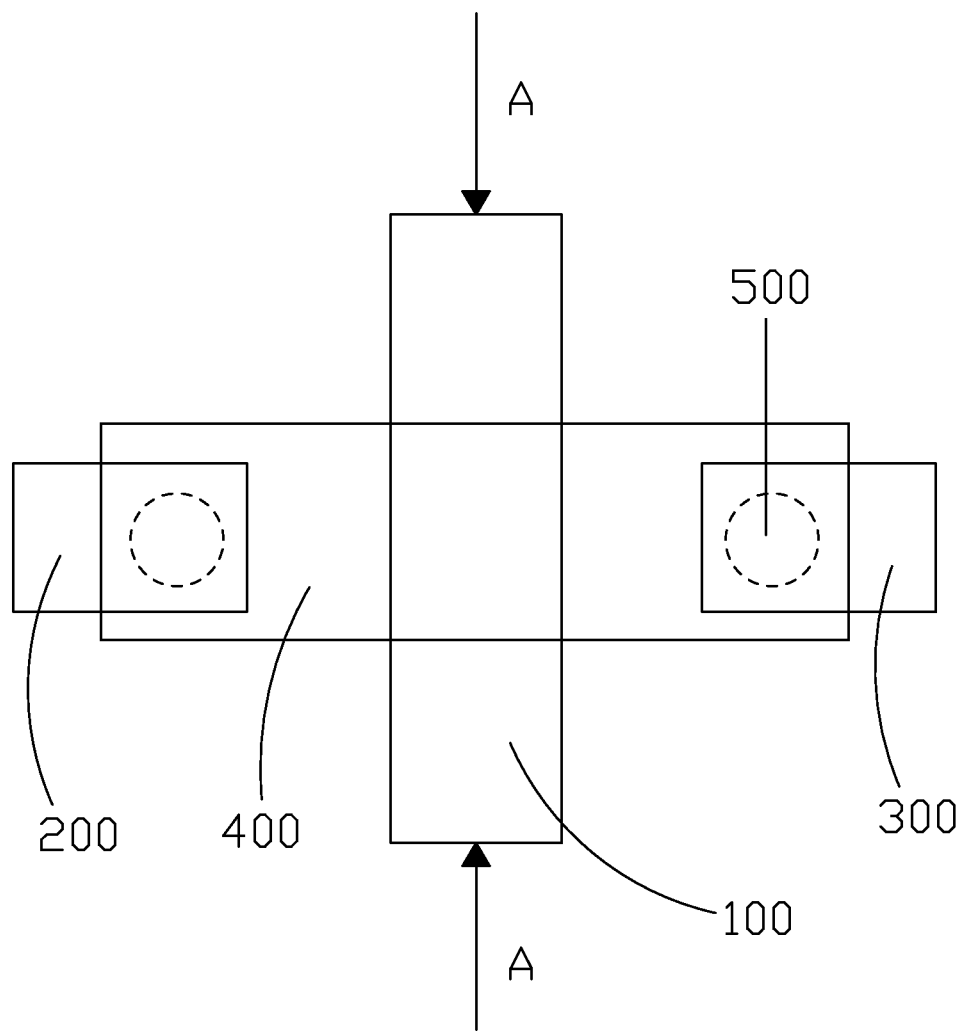
FIG. 1 is a schematic plan view showing a low temperature poly-silicon (LTPS) thin-film transistor (TFT)

FIG. 1 is a schematic plan view showing a low temperature poly-silicon (LTPS) thin-film transistor (TFT). The LTPS TFT comprises a gate 100, a source 200, a drain 300, and an active layer 400. The source 200 and the drain 300 are respectively connected by vias 500 to the active layer 400.

Figure 2:
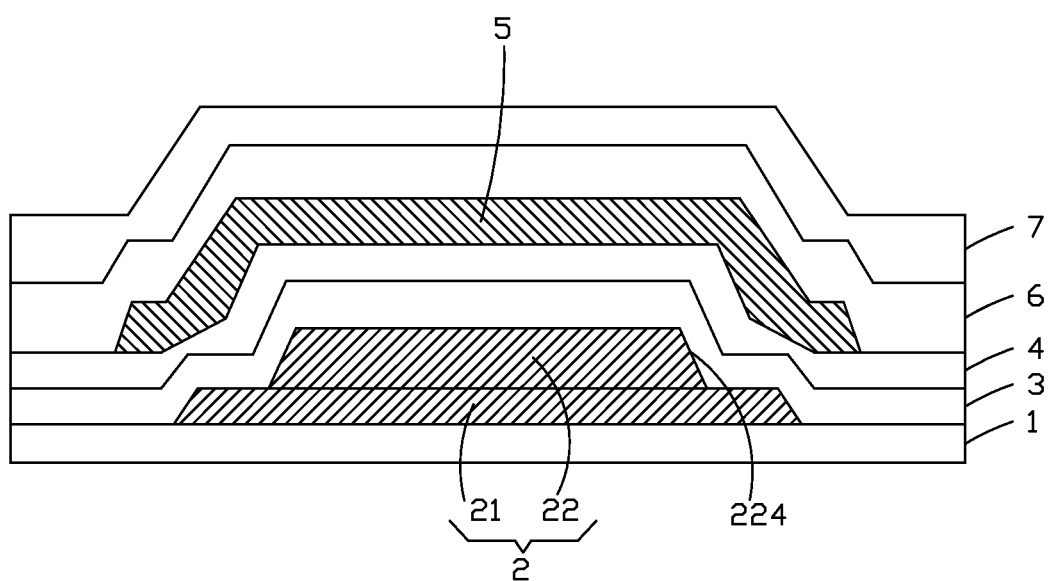
FIG. 2 is a cross-sectional view taken along line A-A of the LTPS TFT according to the present invention.

FIG. 2 is a cross-sectional view of the LTPS TFT according to the present invention taken along line A-A. As shown in FIG. 2, the present invention provides a LTPS TFT, which comprises: a substrate 1, a light shield layer 2 formed on the substrate 1, a pad layer 3 formed on the light shield layer 2, a dielectric layer 4 formed on the pad layer 3, an active layer 5 formed on the dielectric layer 4, a gate insulation layer 6 formed on the active layer 5, and a gate layer 7 formed on the gate insulation layer 6.

Specifically, the light shield layer 2 comprises a planar section 21 formed on the substrate 1 and a raised section 22 formed on the planar section 21. The light shield layer 2 comprises a material of molybdenum. The light shield layer 2 has a thickness at the site of the raised section 22, which is 800-2500 angstroms. The raised section 22 has a height of 300-800 angstroms. Angles between two opposite sidewalls 224 of the raised section 22 and the pad layer 3 are 35°-70°. By forming the raised section 22 on the light shield layer 2, a channel width can be effectively increased without varying an aperture ratio of a display device.

Further, the pad layer 3 comprises a material of silicon nitride having a thickness of 400-500 angstroms. The dielectric layer 4 comprises a material of silicon dioxide having a thickness of 1000-2000 angstroms. The pad layer 3 and the dielectric layer 4 collectively constitute a buffering layer.

Further, the active layer 5 has a projection that covers at least a partial area of an upper surface of the raised section 22 and one of the sidewalls 224 of the raised section 22. The active layer 5 has a thickness of 400-500 angstroms.

Figure 3:
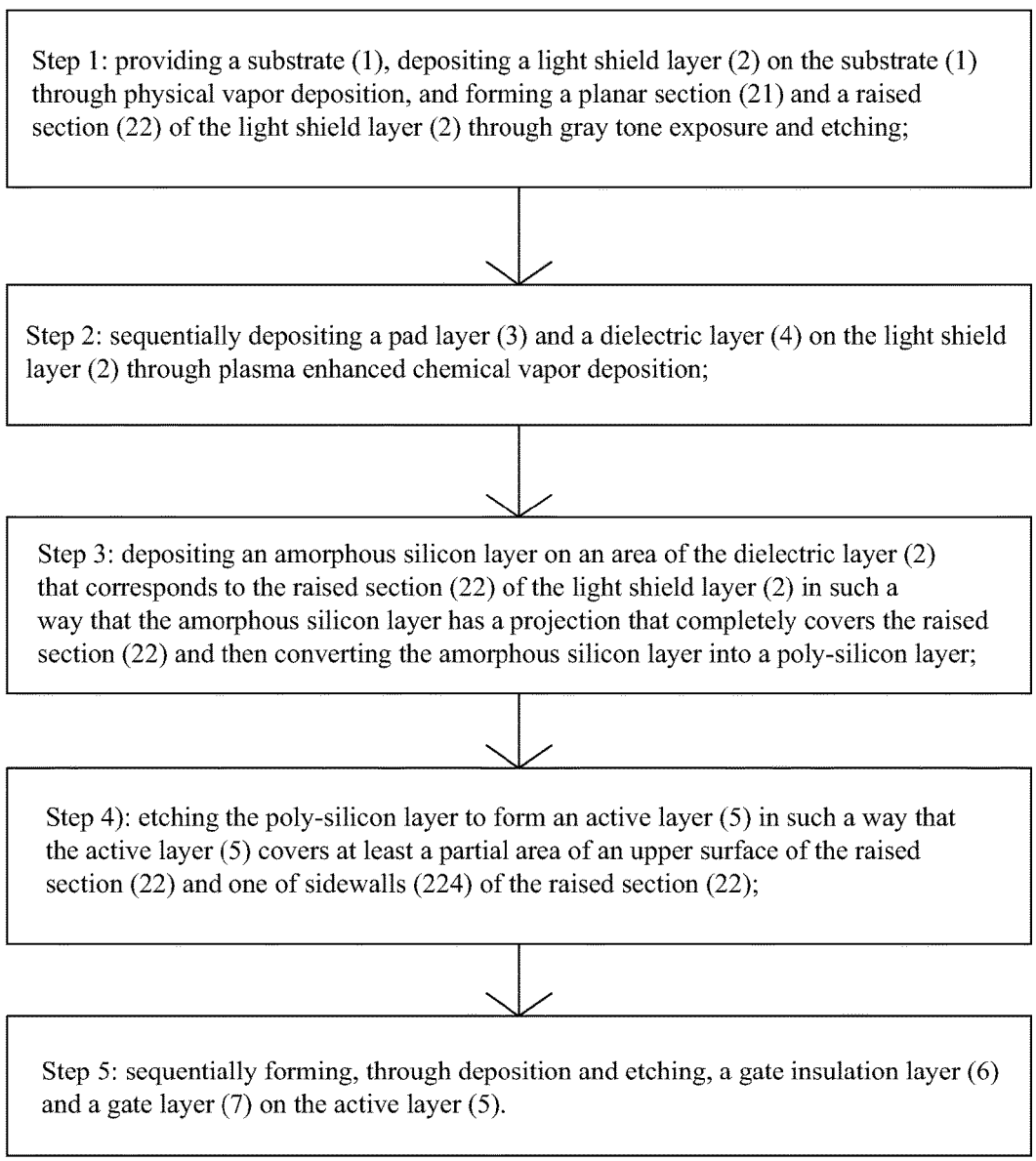
FIG. 3 is a flow chart illustrating a manufacturing method of a LTPS TFT according to the present invention.

Referring to FIGS. 2 and 3, the present invention also provides a manufacturing method of a LTPS TFT, which comprises the following steps:

Step 1: providing a substrate 1, depositing a light shield layer 2 on the substrate 1 through physical vapor deposition, and forming a planar section 21 and a raised section 22 of the light shield layer 2 through gray tone exposure and etching.

Specifically, the light shield layer 2 comprises a material of molybdenum or other similar metals or organic materials. The light shield layer 2 has a thickness at the site of the raised section 22, which is 800-2500 angstroms. The raised section 22 has a height of 300-800 angstroms. Angles between two opposite sidewalls 224 of the raised section 22 and the pad layer 3 are 35°-70°. By forming the raised section 22 on the light shield layer 2 and then forming an active layer on the raised section 22, a channel width can be effectively increased without varying an aperture ratio of a display device.

Specifically, a partial transmission masking process is adopted to form the planar section 21 and the raised section 22 of the light shield layer 2 through dry etching.

Step 2: sequentially depositing a pad layer 3 and a dielectric layer 4 on the light shield layer 2 through plasma enhanced chemical vapor deposition.

Specifically, the deposition temperature is 400 to 450 degrees. The pad layer 3 comprises a material of silicon nitride having a thickness of 400-500 angstroms. The dielectric layer 4 comprises a material of silicon dioxide having a thickness of 1000-2000 angstroms. The pad layer 3 and the dielectric layer 4 collectively constitute a buffering layer.

Step 3: depositing an amorphous silicon layer on an area of the dielectric layer 2 that corresponds to the raised section 22 of the light shield layer 2 in such a way that the amorphous silicon layer has a projection that completely covers the raised section 22 and then converting the amorphous silicon layer into a poly-silicon layer.

Specifically, the amorphous silicon layer is deposited through chemical vapor deposition at a deposition temperature of 400° C.-500° C. with deposited thickness of the amorphous silicon layer being 400-500 angstroms. Excimer laser annealing (ELA) or solid phase crystallization (SPC) is applied to covert the amorphous silicon layer into the poly-silicon layer.

Step 4: etching the poly-silicon layer to form an active layer 5 in such a way that the active layer 5 covers at least a partial area of an upper surface of the raised section 22 and one of sidewalls 224 of the raised section 22.

Specifically, the active layer 5 has a thickness of 400-500 angstroms.

Step 5: sequentially forming, through deposition and etching, a gate insulation layer 6 and a gate layer 7 on the active layer 5.

Further, the manufacturing method of the LTPS TFT may additionally comprises:

Step 6: additionally depositing a dielectric layer on a surface of the substrate 1 that comprises the gate layer 7, wherein the dielectric layer comprises a material of silicon oxide or silicon nitride; then forming, in the dielectric layer and the gate insulation layer 6, contact holes that are respectively in direct engagement with a source and a drain by means of photolithography and etching; and Step 7: finally depositing a second metal layer, such as an aluminum layer, a tungsten layer, or a single layer of other metals or a combined multilayer conductor layer on a surface of the substrate 1; and the forming a source and a drain through photolithography and etching so as to electrically connect a signal from the source to the drain to thereby complete the manufacturing process of the entire LTPS TFT.

In summary, the present invention provides a LTPS TFT and a manufacturing method thereof, which comprises formation of a light shield layer having a raised portion on the substrate and then formation of other constituent portions on the light shield layer in order to effectively increase a width of a channel of the LTPS TFT and a width-to-length ratio of the channel to increase an open state current and thus improving the driving power and device performance of the LTPS TFT but not affecting the aperture ratio of the display device. The manufacturing method used has a simple process and is easy to operate.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A low temperature poly-silicon thin-film transistor (LTPS TFT), comprising: a substrate, a light shield layer formed on the substrate, a pad layer formed on the light shield layer, a dielectric layer formed on the pad layer, an active layer formed on the dielectric layer and extending in a longitudinal direction between a source electrode and a drain electrode, a gate insulation layer formed on the active layer, and a gate layer formed on the gate insulation layer;
wherein the light shield layer comprises a planar section formed on the substrate and a raised section formed on a top surface of the planar section such that a step is formed between each of two opposite sidewalls of the raised section that are opposite to each other in a lateral direction that is substantially perpendicular to the longitudinal direction and the top surface of the planar section and comprising an inclined side surface, the inclined side surfaces converging toward each other in a direction away from the top surface of the planar section; and
wherein the active layer that extends in the longitudinal direction between the source electrode and the drain electrode has two opposite lateral sides in the lateral direction, at least one of the two opposite lateral sides of the active layer forming an extended sidewall corresponding to the inclined side surface of one of the two opposite sidewalls of the raised section of the light shield layer so as to increase a lateral dimension of the active layer between the two lateral sides of the active layer; and
the active layer has a projection that covers at least a partial area of an upper surface of the raised section and the inclined side surface of the one of the two opposite sidewalls of the raised section in the lateral direction.

2. The LTPS TFT as claimed in claim 1, wherein the light shield layer comprises a material of molybdenum.

3. The LTPS TFT as claimed in claim 2, wherein the light shield layer has a thickness at the site of the raised section, which is 800-2500 angstroms; the raised section has a height of 300-800 angstroms; angles between the two opposite sidewalls of the raised section and the pad layer are 35°-70°.

4. The LTPS TFT as claimed in claim 1, wherein the pad layer comprises a material of silicon nitride having a thickness of 400-500 angstroms and the dielectric layer comprises a material of silicon dioxide having a thickness of 1000-2000 angstroms.

5. The LTPS TFT as claimed in claim 1, wherein the active layer has a thickness of 400-500 angstroms.

6. A low temperature poly-silicon thin-film transistor (LTPS TFT), comprising: a substrate, a light shield layer formed on the substrate, a pad layer formed on the light shield layer, a dielectric layer formed on the pad layer, an active layer formed on the dielectric layer and extending in a longitudinal direction between a source electrode and a drain electrode, a gate insulation layer formed on the active layer, and a gate layer formed on the gate insulation layer;
wherein the light shield layer comprises a planar section formed on the substrate and a raised section formed on a top surface of the planar section such that a step is formed between each of two opposite sidewalls of the raised section that are opposite to each other in a lateral direction that is substantially perpendicular to the longitudinal direction and the top surface of the planar section and comprising an inclined side surface, the inclined side surfaces converging toward each other in a direction away from the top surface of the planar section; and
wherein the active layer that extends in the longitudinal direction between the source electrode and the drain electrode has two opposite lateral sides in the lateral direction, at least one of the two opposite lateral sides of the active layer forming an extended sidewall corresponding to the inclined side surface of one of the two opposite sidewalls of the raised section of the light shield layer so as to increase a lateral dimension of the active layer between the two lateral sides of the active layer; and
the active layer has a projection that covers at least a partial area of an upper surface of the raised section and the inclined side surface of the one of the two opposite sidewalls of the raised section in the lateral direction;
wherein the light shield layer comprises a material of molybdenum; and wherein the pad layer comprises a material of silicon nitride having a thickness of 400-500 angstroms and the dielectric layer comprises a material of silicon dioxide having a thickness of 1000-2000 angstroms.

7. The LTPS TFT as claimed in claim 6, wherein the light shield layer has a thickness at the site of the raised section, which is 800-2500 angstroms; the raised section has a height of 300-800 angstroms; angles between the two opposite sidewalls of the raised section and the pad layer are 35°-70°.

8. The LTPS TFT as claimed in claim 6, wherein the active layer has a thickness of 400-500 angstroms.

* * * * *